(12) United States Patent
Miles

(10) Patent No.: US 10,060,982 B2
(45) Date of Patent: Aug. 28, 2018

(54) DETECTING FAULTS IN MOTORS AND DRIVES

(71) Applicant: Hamilton Sundstrand Corporation, Charlotte, NC (US)

(72) Inventor: Gary L. Miles, Stillman Valley, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 48 days.

(21) Appl. No.: 14/200,843

(22) Filed: Mar. 7, 2014

(65) Prior Publication Data

US 2014/0300307 A1 Oct. 9, 2014

Related U.S. Application Data

(60) Provisional application No. 61/808,591, filed on Apr. 4, 2013.

(51) Int. Cl.

| *G01R 19/10* | (2006.01) |
|---|---|
| *H02P 7/29* | (2016.01) |
| *F04B 35/04* | (2006.01) |
| *G01R 31/34* | (2006.01) |
| *H02P 29/00* | (2016.01) |
| *G01R 31/40* | (2014.01) |
| *H02P 1/04* | (2006.01) |

(52) U.S. Cl.
CPC .............. *G01R 31/34* (2013.01); *G01R 31/40* (2013.01); *H02P 1/04* (2013.01); *H02P 29/00* (2013.01)

(58) Field of Classification Search
CPC ......... H02P 7/2913; F04B 35/04; G01R 19/10

USPC .......... 318/490, 782, 800, 400.21, 437, 729; 361/30

See application file for complete search history.

(56) References Cited

U.S. PATENT DOCUMENTS

| 4,833,628 A * | 5/1989 | Curran, Jr. ................ H02P 1/28 318/729 |
|---|---|---|
| 5,959,430 A * | 9/1999 | Yuki ....................... H02P 21/09 318/805 |
| 7,002,318 B1 * | 2/2006 | Schulz .................. B60L 3/0038 318/437 |
| 2002/0008485 A1 * | 1/2002 | Yabe ........................ B60S 1/08 318/443 |
| 2005/0029976 A1 * | 2/2005 | Terry ...................... F04B 35/04 318/400.21 |

(Continued)

FOREIGN PATENT DOCUMENTS

EP 2458728 A2 5/2012

OTHER PUBLICATIONS

European Search Report Issued in EP Application No. 14163124.2, dated Apr. 20, 2016, 8 Pages.

*Primary Examiner* — Kawing Chan
*Assistant Examiner* — Cortez Cook
(74) *Attorney, Agent, or Firm* — Cantor Colburn LLP

(57) ABSTRACT

Disclosed herein is a system and method for determining faults in motors and drives. The system includes a motor drive that has a DC-link coupled to a power source. A controller system is configured to measure power applied to the DC-link, integrate the power over time to yield energy consumed, and to determine energy that accumulates in operation over time. The controller is further configured to detect a fault condition when the energy that accumulates in operation is less than expected based on the energy consumed.

9 Claims, 3 Drawing Sheets

(56) References Cited

U.S. PATENT DOCUMENTS

| | | | |
|---|---|---|---|
| 2005/0151658 A1* | 7/2005 | Kono | B60L 3/0023 |
| | | | 318/490 |
| 2009/0167229 A1 | 7/2009 | Brunner et al. | |
| 2009/0225479 A1* | 9/2009 | Jayanth | G01R 19/10 |
| | | | 361/30 |
| 2010/0244760 A1* | 9/2010 | Anwar | G01R 31/025 |
| | | | 318/490 |
| 2012/0286715 A1* | 11/2012 | Nakajima | H02P 7/2913 |
| | | | 318/450 |

* cited by examiner

DETECTING FAULTS IN MOTORS AND DRIVES

CROSS-REFERENCE TO RELATED APPLICATIONS

This patent application claims priority to U.S. Provisional Application No. 61/808,591, filed Apr. 4, 2013, which is incorporated herein by reference in its entirety.

BACKGROUND

The ability of a motor drive to protect a system in the event of output feeder and/or motor electrical faults has historically relied upon direct monitoring of electrical output data via dedicated sensors and establishing limits upon the data readings under defined conditions. The nature of motor drives and motors creates a wide range of startup and operating conditions and control schemes under which detection of certain faults may present specific challenges. In addition, with the advent of the more electric architecture aircraft, where many high power loads are driven by motor drives, the amount of power and energy that can feed a fault condition poses potentially hazardous conditions in the event of certain failures.

SUMMARY

Disclosed herein is a method for detecting faults in a motor drive. The method includes measuring electrical power applied to the motor drive. The electrical power applied over time is integrated to yield electrical energy consumed. The electrical power is then compared to an output condition to determine an existence of a fault in the motor drive.

Also disclosed herein is a system including a motor drive. The motor drive includes a DC-link coupled to a power source. A controller system is configured to measure power applied to the DC-link, integrate the power over time to yield energy consumed, and to determine energy that accumulates in operation over time. The controller is further configured to detect a fault condition when the energy that accumulates in operation is less than expected based on the energy consumed.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. In the FIGURES.

DETAILED DESCRIPTION

Figure 1:
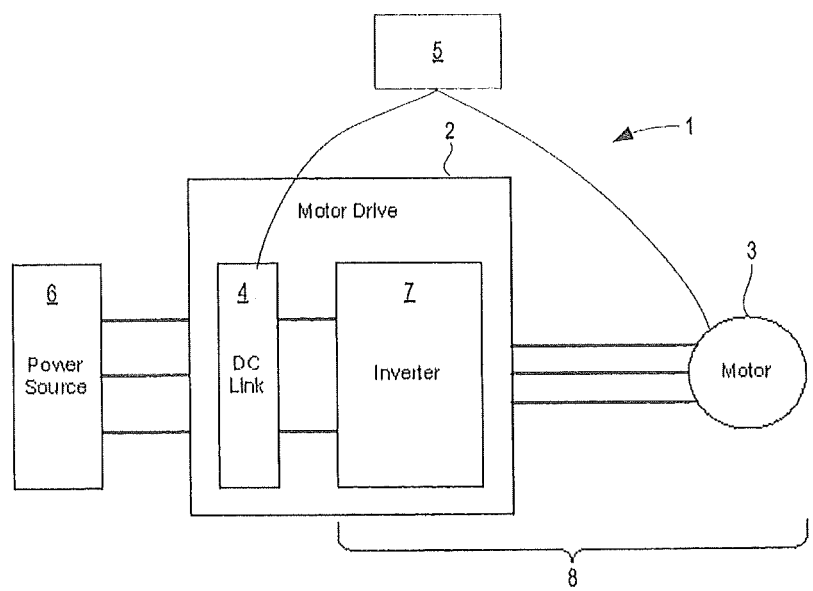
FIG. 1 illustrates a schematic view of a motor drive system, according to an embodiment.

The following disclosure describes several exemplary embodiments for implementing different features, structures, or functions of the invention. Exemplary embodiments of components, arrangements, and configurations are described below to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function.

In the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases.

In general, the present disclosure is directed to systems and methods by which indirect data which is readily available and easily monitored and processed can be utilized to infer that a fault condition covering a variety of failures exists which, if left undetected, could lead to a hazardous condition. This systems and methods utilize the DC Link voltage and current powering the motor drive and processing the resulting energy that accumulates in operation over defined constraints. Criteria based on boundaries for specific operating conditions can be established from which a fault can be determined exits.

FIG. 1 illustrates a schematic view of a motor system 1, according to an embodiment. The system 1 includes a motor drive 2 under certain conditions operates as a current controlled source to drive a motor 3. This mode of control presents challenges in identifying a variety of output fault conditions particularly when the faults may be balanced or a low level on the output.

Further, the motor drive may include a DC Link 4 from which DC Link voltage and current are generally monitored for control and protection purposes, for example, by a controller system 5. The controller 5 may also monitor operating conditions of the motor 3. The DC link 4 may be coupled to a DC power source 6 and an inverter 7. The system 1 may include an extended zone of coverage 8 that is protected against faults, as shown in FIG. 1. Typical protection schemes require dedicated sensing elements and monitors to protect against the individual zones or components of a feeder (e.g. individual current sensing on each feeder). However, certain fault conditions exist that individual sensing may not detect including but not limited to balanced 3-phase faults.

The system 1, however, utilizes the DC link voltage and current and processes the data in real time to calculate the energy consumed by the motor drive 2. This is accomplished by integrating the calculated input power over various defined constraints. Such constraints can be time or event-based. For example, one constraint may be a startup of the system 1, such that the system 1 may be monitored for faults until the motor 3 reaches a nominal operating speed. Since conditions of operation can be bound by a number of methods including establishing predetermined constraints or by measured output parameters, the total energy consumed can provide a means to identify a fault condition in the motor drive or motor system over a variety of operating conditions.

Another advantage of utilizing energy draw is that the level of power consumed by a fault will integrate over time in the energy calculation providing more robust detection of high impedance, low level, or time varying fault conditions.

Figure 2:
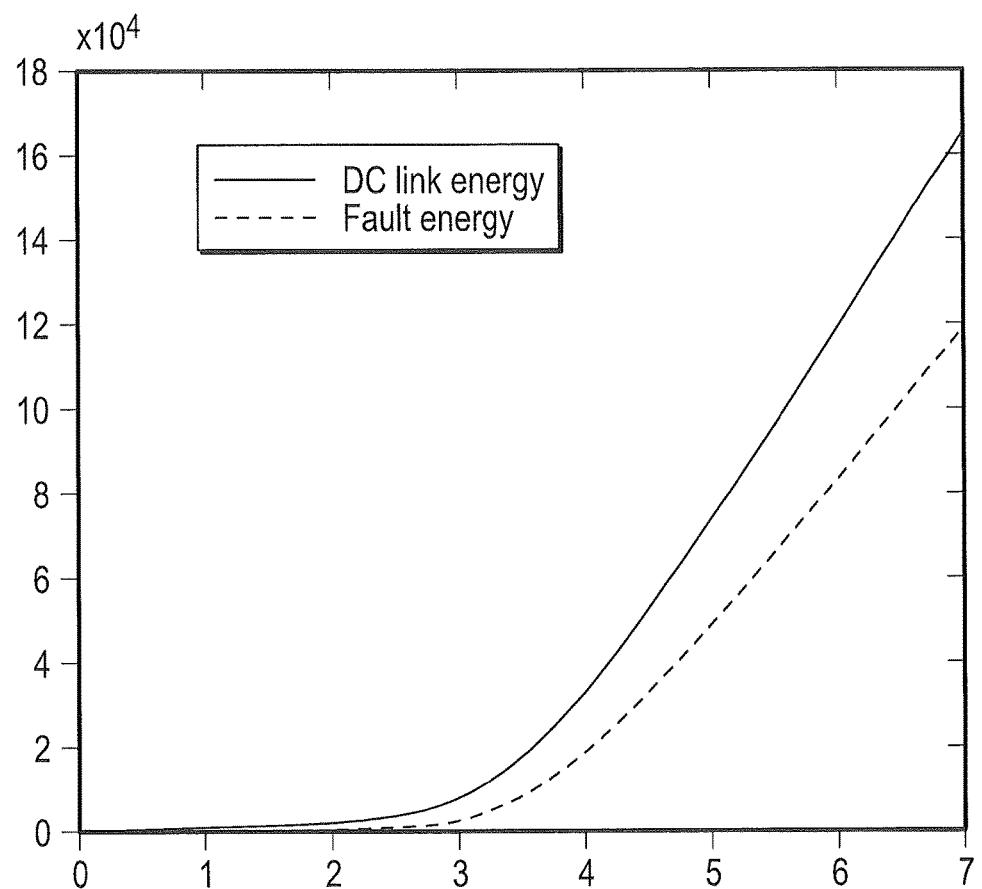
FIG. 2 illustrates a plot of DC link energy and fault energy versus time, according to an embodiment.

FIG. 2 illustrates a plot of a simulated fault condition, according to an embodiment. In this case, calculated energy in the fault and total DC link energy are plotted over time. This illustrates the advantage of integrating the power to amplify the fault condition.

Figure 3:
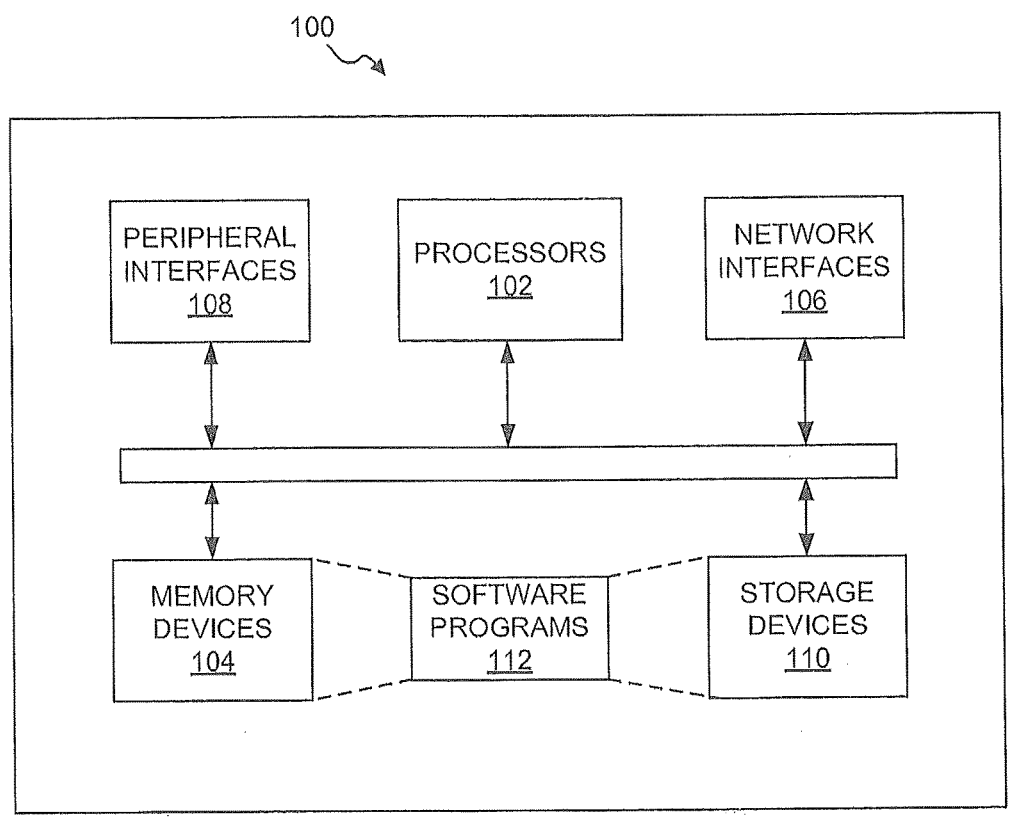
FIG. 3 is a schematic showing a processor system, according to another embodiment.

Embodiments of the disclosure may also include one or more processor (i.e., computing) systems which may be implemented by the system 1, portions thereof (e.g., the controller 5), or partially implemented one or more processor systems. FIG. 3 illustrates a schematic view of such a processor system 100, according to an embodiment. The processor system 100 may include one or more processors 102 of varying core (including multiple core) configurations and clock frequencies. The one or more processors 102 may be operable to execute instructions, apply logic, etc. It will be appreciated that these functions may be provided by multiple processors or multiple cores on a single chip operating in parallel and/or communicably linked together.

The processor system 100 may also include a memory system, which may be or include one or more memory devices and/or computer-readable media 104 of varying physical dimensions, accessibility, storage capacities, etc. such as flash drives, hard drives, disks, random access memory, etc., for storing data, such as images, files, and program instructions for execution by the processor 102. In an embodiment, the computer-readable media 104 may store instructions that, when executed by the processor 102, are configured to cause the processor system 100 to perform operations. For example, execution of such instructions may cause the processor system 100 to implement one or more portions and/or embodiments of the methods described above and/or provide at least a portion of the controller 5.

The processor system 100 may also include one or more network interfaces 108. The network interfaces 108 may include any hardware, applications, and/or other software. Accordingly, the network interfaces 108 may include Ethernet adapters, wireless transceivers, PCI interfaces, and/or serial network components, for communicating over wired or wireless media using protocols, such as Ethernet, wireless Ethernet, etc.

The processor system 100 may further include one or more peripheral interfaces 106, for communication with a display screen, projector, keyboards, mice, touchpads, sensors, other types of input and/or output peripherals, and/or the like. In some implementations, the components of processor system 100 need not be enclosed within a single enclosure or even located in close proximity to one another, but in other implementations, the components and/or others may be provided in a single enclosure.

The memory device 104 may be physically or logically arranged or configured to store data on one or more storage devices 110. The storage device 110 may include one or more file systems or databases in any suitable format. The storage device 110 may also include one or more software programs 112, which may contain interpretable or executable instructions for performing one or more of the disclosed processes. When requested by the processor 102, one or more of the software programs 112, or a portion thereof, may be loaded from the storage devices 110 to the memory devices 104 for execution by the processor 102.

Those skilled in the art will appreciate that the above-described componentry is merely one example of a hardware configuration, as the processor system 100 may include any type of hardware components, including any necessary accompanying firmware or software, for performing the disclosed implementations. The processor system 100 may also be implemented in part or in whole by electronic circuit components or processors, such as application-specific integrated circuits (ASICs) or field-programmable gate arrays (FPGAs).

The foregoing description of several possible embodiments has been presented for purposes of illustration only. It is not exhaustive and does not limit the present disclosure to the precise form disclosed. Those skilled in the art will appreciate from the foregoing description that modifications and variations are possible in light of the above teachings or may be acquired from practicing the disclosed embodiments.

For example, the same techniques described herein with reference to the processor system 100 may be used to execute programs according to instructions received from another program or from another computing system altogether. Similarly, commands may be received, executed, and their output returned entirely within the processing and/or memory of the processor system 100. Accordingly, neither a visual interface command terminal nor any terminal at all is strictly necessary for performing the described embodiments.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. A method for detecting a variety of output fault conditions in a motor drive, comprising:
   measuring, using a controller, electrical power applied to the motor drive, wherein the motor drive operates as a current controlled source to drive a motor;
   amplifying, using the controller, the electrical power applied over time to yield electrical energy consumed;
   comparing, using the controller, the electrical energy consumed to an expected electrical power condition to determine an existence of the variety of output fault conditions in the motor drive over a plurality of operating conditions, wherein the expected electrical power condition is an amount of energy applied by the motor drive to the motor coupled to the motor drive; and configuring at least a portion of the motor drive, the motor coupled thereto, or both to shut down based at least in part on the controller determining that at least one of the variety of output fault conditions is detected;

wherein the variety of output fault conditions includes balanced three-phase faults.

2. The method of claim 1, wherein measuring the electrical power applied to the motor drive comprises:

measuring a voltage applied to a DC-link of the motor drive;

measuring a current applied to the DC-link; and multiplying the voltage and the current.

3. The method of claim 1, further comprising:

determining an amount of power consumed by the variety of output fault conditions; and integrating the amount of power consumed by the variety of output fault conditions over time.

4. The method of claim 1, wherein the plurality of operating conditions are constrained to a predetermined amount of time, a speed of the motor coupled to the motor drive, or both.

5. The method of claim 4, wherein the predetermined amount of time is associated with a startup of the motor.

6. A system, comprising:

a motor drive comprising a DC-link coupled to a power source;

a motor electrically coupled to the motor drive, wherein the motor drive operates as a current controlled source to drive the motor; and a controller system configured to measure power applied to the DC-link, amplify the power by integrating the power over time to yield energy consumed, and to determine energy that accumulates in operation over time, wherein the controller is further configured to detect a variety of output fault conditions when the energy that accumulates in operation over time is less than expected based on the energy consumed, wherein the expected energy that accumulates is an amount of enemy applied by the motor drive to the motor coupled to the motor drive;

wherein the controller system is configured to shutdown at least a portion of the system when at least one of the variety of output fault conditions is detected;

wherein the variety of output fault conditions includes balanced three-phase faults.

7. The system of claim 6, wherein the controller system is configured to detect the variety of output fault conditions during a predetermined time constraint.

8. The system of claim 7, wherein the predetermined time constraint is associated with a startup time for the motor.

9. The system of claim 6, wherein the controller system is further configured to detect an amount of energy consumed by at least one of the variety of output fault conditions over time.

* * * * *